US008243494B2

(12) United States Patent
Lai et al.

(10) Patent No.: US 8,243,494 B2
(45) Date of Patent: Aug. 14, 2012

(54) SELF-ALIGNED STRUCTURE AND METHOD FOR CONFINING A MELTING POINT IN A RESISTOR RANDOM ACCESS MEMORY

(75) Inventors: Erh-Kun Lai, Taichung County (TW); ChiaHua Ho, Kaohsiung (TW); Kuang Yeu Hsieh, Hsinchu (TW); Shih-Hung Chen, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 243 days.

(21) Appl. No.: 12/235,773

(22) Filed: Sep. 23, 2008

(65) Prior Publication Data
US 2009/0020746 A1    Jan. 22, 2009

Related U.S. Application Data

(62) Division of application No. 11/465,094, filed on Aug. 16, 2006, now Pat. No. 7,442,603.

(51) Int. Cl.
*G11C 16/02* (2006.01)
*H01L 29/417* (2006.01)

(52) U.S. Cl. .............. 365/148; 257/E27.103; 438/238; 438/384; 438/739

(58) Field of Classification Search .............. 438/238, 438/384, 739; 257/148, E27.071, E21.004, 257/E27.103; 365/148
See application file for complete search history.

(56) References Cited

U.S. PATENT DOCUMENTS

| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,567 A | 1/1993 | Klersy et al. |

(Continued)

FOREIGN PATENT DOCUMENTS
CN    1547268    11/2004
(Continued)

OTHER PUBLICATIONS

Adler, David, "Amorphous-Semiconductor Devices," Sci. Amer., vol. 236, pp. 36-48, May 1977.

(Continued)

*Primary Examiner* — George Fourson, III
(74) *Attorney, Agent, or Firm* — Kenta Suzue; Haynes Beffel & Wolfeld LLP

(57) ABSTRACT

A process in the manufacturing of a resistor random access memory with a confined melting area for switching a phase change in the programmable resistive memory. The process initially formed a pillar comprising a substrate body, a first conductive material overlying the substrate body, a programmable resistive memory material overlying the first conductive material, a high selective material overlying the programmable resistive memory material, and a silicon nitride material overlying the high selective material. The high selective material in the pillar is isotropically etched on both sides of the high selective material to create a void on each side of the high selective material with a reduced length. A programmable resistive memory material is deposited in a confined area previously occupied by the reduced length of the poly, and the programmable resistive memory material is deposited into an area previously occupied by the silicon nitride material.

19 Claims, 11 Drawing Sheets

U.S. PATENT DOCUMENTS

| | | | |
|---|---|---|---|
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A * | 8/1998 | Reinberg | 257/3 |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,970,336 A * | 10/1999 | Wolstenholme et al. | 438/238 |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,563 B2 | 10/2004 | Xu | |
| 6,815,704 B1 | 11/2004 | Chen | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen et al. | |
| 7,635,855 B2 * | 12/2009 | Chen et al. | 257/4 |
| 2003/0203509 A1 | 10/2003 | Rizzo et al. | |
| 2004/0248339 A1 | 12/2004 | Lung | |
| 2005/0077515 A1* | 4/2005 | Kostylev et al. | 257/52 |
| 2005/0215009 A1 | 9/2005 | Cho | |
| 2006/0261321 A1* | 11/2006 | Happ et al. | 257/1 |
| 2007/0108431 A1* | 5/2007 | Chen et al. | 257/4 |
| 2007/0298535 A1 | 12/2007 | Lung | |
| 2008/0026547 A1 | 1/2008 | Yin et al. | |
| 2008/0043520 A1* | 2/2008 | Chen | 365/163 |

FOREIGN PATENT DOCUMENTS

| | | |
|---|---|---|
| WO | WO-0079539 | 12/2000 |
| WO | WO-0145108 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20high%20density%20high%20performance%20phase%20change%20memory<http://klabs.org/richcontent/MAPLDCon99/Papers/P21_Tyson_P.PDF#search='nonvolatile%20high%20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

SELF-ALIGNED STRUCTURE AND METHOD FOR CONFINING A MELTING POINT IN A RESISTOR RANDOM ACCESS MEMORY

CROSS-REFERENCE TO RELATED APPLICATIONS

This application is a divisional application of U.S. application Ser. No. 11/465,094 filed 16 Aug. 2006.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive memory material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive memory material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

A specific issue arising from conventional phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

Moreover, problems have arisen in manufacturing such devices with very small dimensions, and with variations in process that meets tight specifications needed for large-scale memory devices. It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

The present invention describes a process in the manufacturing of a programmable resistive memory, such as a resistor random access memory (RRAM), with a confined melting area for switching a phase change in the programmable resistive memory. The process initially involves forming a pillar comprising a substrate body, a first conductive material overlying the substrate body, a programmable resistive memory material overlying the first conductive material, a high selectivity material overlying the programmable resistive memory material, and a silicon nitride material overlying the high selective material. The pillar is isotropically etched on both sides of the high selectivity material to create a void on each side of the high selective material with a reduced length. SOG (spin-on-glass) film or spin coating is used to fill up the voids and the surrounding areas of the pillar. The silicon nitride material is etched away, either by wet etching or dry etching, to expose the reduced length of the poly. The reduced length of the poly is then etched away. A programmable resistive memory material is deposited in a confined area (kernal member) previously occupied by the reduced length of the poly, and the programmable resistive memory material is deposited into an area (upper programmable resistive memory member) previously occupied by the silicon nitride material. Deposition and patterning of a top electrode overlying the upper programmable resistive memory member is carried out to complete the process.

An electrical current flows between the upper programmable resistive memory member, the kernal member and the lower programmable resistive memory member. The kernal member is self-aligned with the upper and lower programmable resistive memory members so that the electrical current flows substantially near the center of the kernal. The kernal member is in a confined area that comprises a programmable resistive memory material having at least two solid phases which are reversibly inducible by a current.

A memory device structure is also described with a kernal member comprising a programmable resistive memory material in contact with an upper programmable resistive memory material and in contact with a lower programmable resistive memory material. A top electrode overlies the upper programmable resistive memory material. A bottom electrode underlies the bottom programmable resistive memory material and overlies a tungsten plug. An electrical current flows from the top electrode, through the upper programmable resistive memory material, through the kernal, through the lower programmable resistive memory material, and to the bottom electrode.

Advantageously, the present invention reduces the amount of heat dissipation in which the upper and lower programmable resistive memory members assist in dissipating heat generated from a heating region of the kernel. The present invention also reduces the amount of programming current.

The structures and methods of to the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
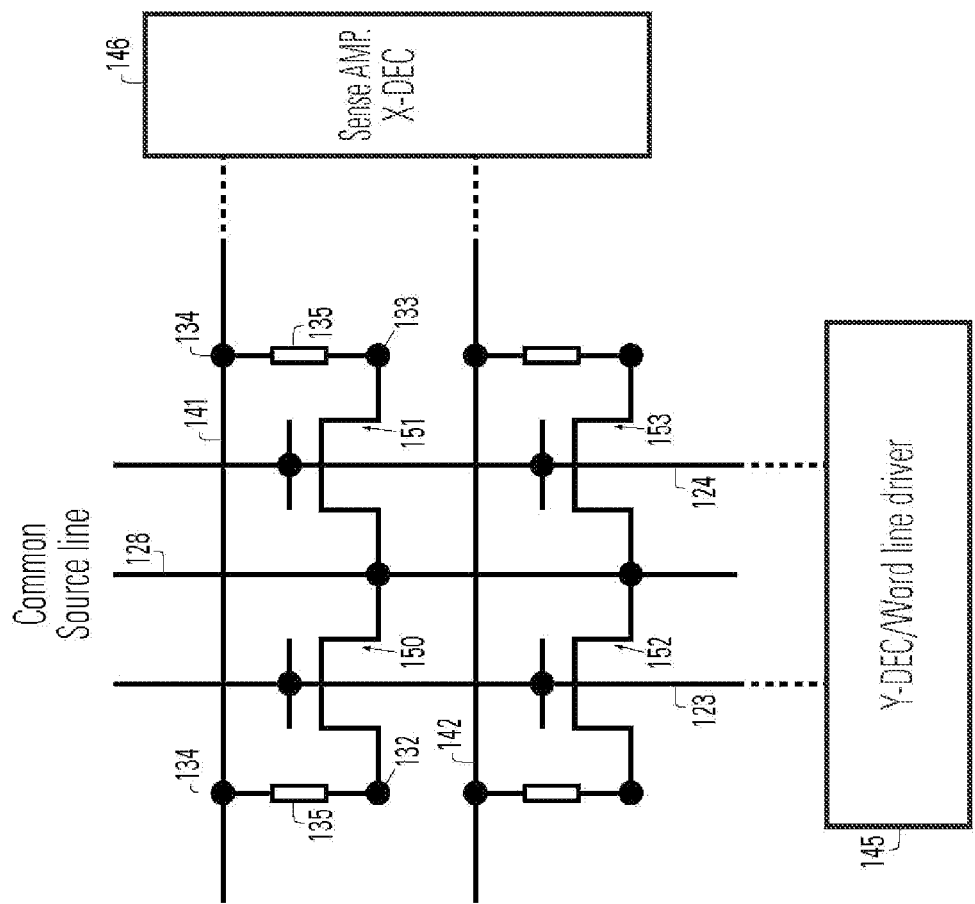
FIG. 1 illustrates a schematic of a bistable resistance random access memory array in accordance with the present invention.

A description of structural embodiments and methods of the present invention is provided with reference to FIGS. 1-11. It is to be understood that there is no intention to limit the invention to the specifically disclosed embodiments but that the invention may be practiced using other features, elements, methods and embodiments. Like elements in various embodiments are commonly referred to with like reference numerals.

Referring now to FIG. 1, there is shown a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for side wall pin memory cell 135, which has top electrode member 134. The top electrode member 134 is coupled to the bit line 141. Likewise, the drain of access transistor 151 is coupled to the bottom electrode member 133 for side wall pin memory cell 136, which has top electrode member 137. The top electrode member 137 is coupled to the bit line 141. Access transistors 152 and 153 are coupled to corresponding side wall pin memory cells as well on bit line 142. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
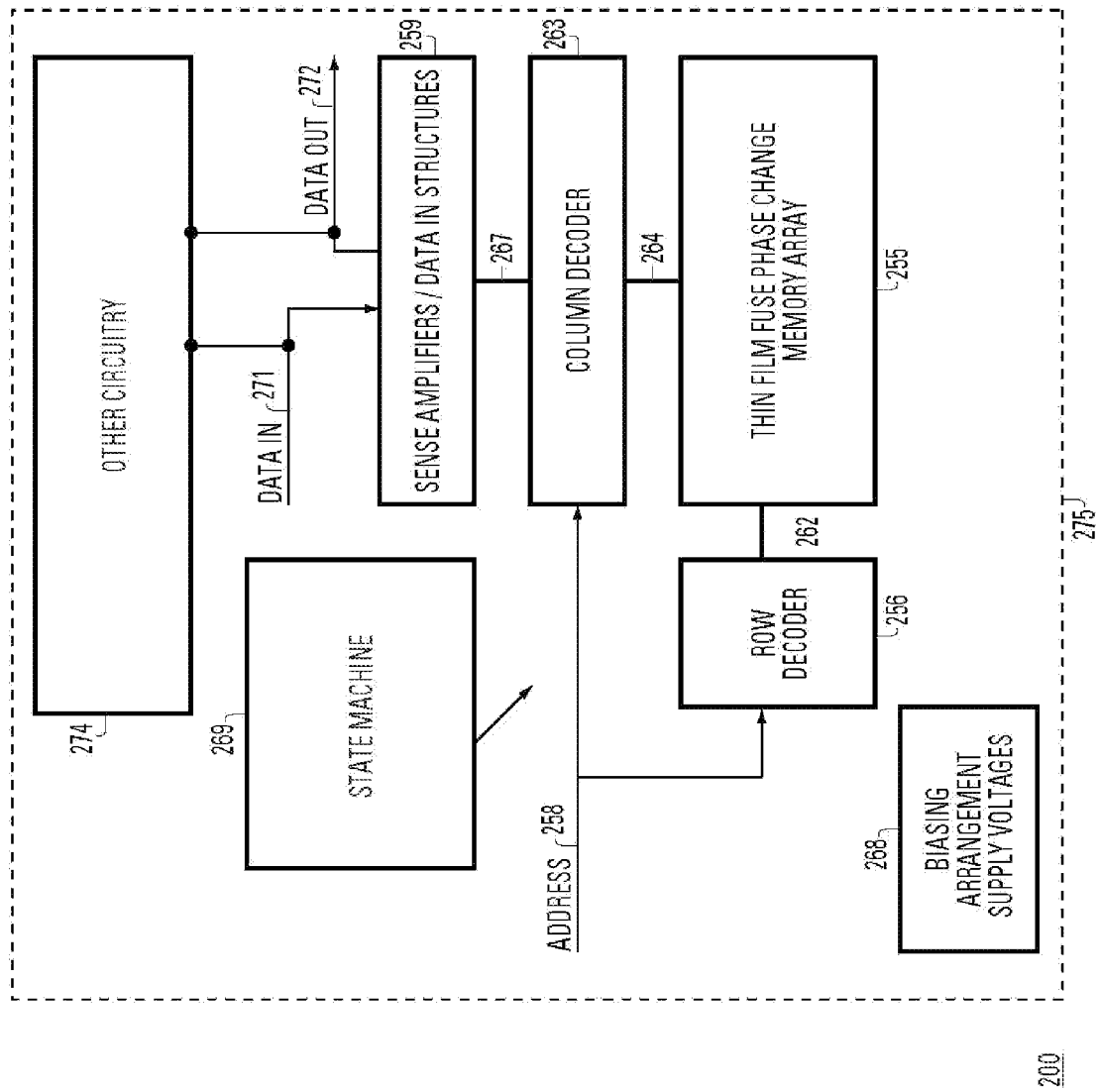
FIG. 2 illustrates a simplified block diagram of an integrated circuit according to an embodiment of the present invention.

As illustrated in FIG. 2, there is shown a simplified block diagram of an integrated circuit according to an embodiment of the present invention. The integrated circuit 275 includes a memory array implemented using side wall active pin bistable resistance random access memory cells, on a semiconductor substrate. A row decoder 256 is coupled to a plurality of word lines 262, and arranged along rows in the memory array 255. A column decoder 263 is coupled to a plurality of bit lines 264 arranged along pins in the memory array 255 for reading and programming data from the side wall pin memory cells in the array 255. Addresses are supplied on a bus 258 to the column decoder 263 and a row decoder 256. Sense amplifiers and data-in structures in a block 259 are coupled to the column decoder 263 via a data bus 267. Data is supplied via the data-in line 271 from input/output ports on the integrated circuit 275 or from other data sources internal or external to the integrated circuit 275, to the data-in structures in the block 259. In the illustrated embodiment, other circuitry 274 is included on the integrated circuit, such as a general purpose processor or special purpose application circuitry, or a combination of modules providing system-on-a-chip functionality supported by the thin film fuse bistable resistance random access memory cell array. Data is supplied via the data-out line 272 from the sense amplifiers in the block 259 to input/output ports on the integrated circuit 275, or to other data destinations internal or external to the integrated circuit 275.

A controller implemented in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
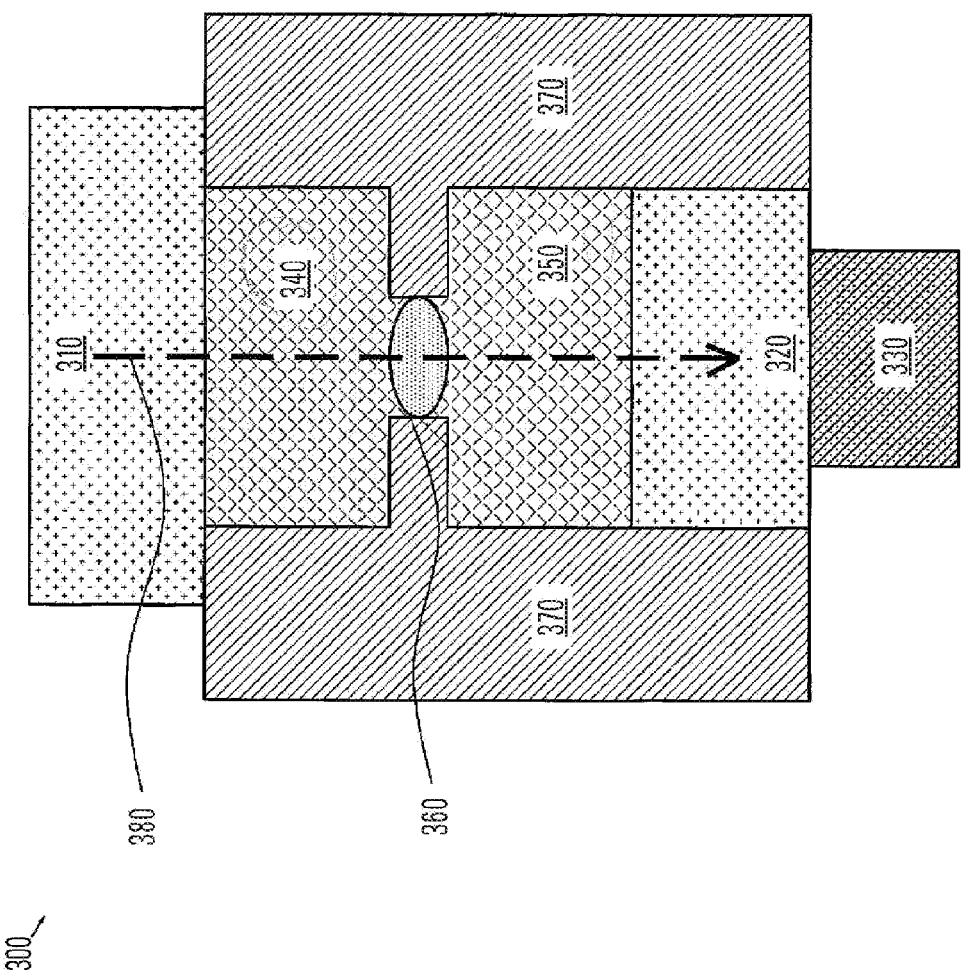
FIG. 3 illustrates a cross-sectional view of a process diagram with a confined melting point structure in a bistable resistance random access memory in accordance with the present invention.

Turning now to FIG. 3, there is shown a cross-sectional view of a process diagram with a confined melting point structure 300 in a bistable resistance random access memory. The confined melting point structure 300 comprises a top electrode 310 vertically separated from a bottom electrode 320, which is in electrical contact with a tungsten plug 330. An upper programmable resistive memory material (or resistor film) 340 is in contact with the top electrode 310, while a lower programmable resistive memory material 350 is in contact with the bottom electrode 320. A programmable resistive memory material in a narrow area, referred to as a kernel member 360, is positioned in between and in contact with the upper programmable resistive memory material 340 and the lower programmable resistive memory material 350. An interlevel dielectric material 370, such as spin-on glass (SOG), is deposited to fill up the voids and surrounding area. The kernel member 360 has a first void on the left side and a second void on the right side. The heat generated from the confined melting point structure 300 is confined substantially within the programmable resistive memory material of the kernel member 360. An electrical current 380 flows from the top electrode 310, through the upper programmable resistive memory material 340, the programmable resistive memory material 360, the lower programmable resistive memory material 350, and the bottom electrode 320.

Figure 4:
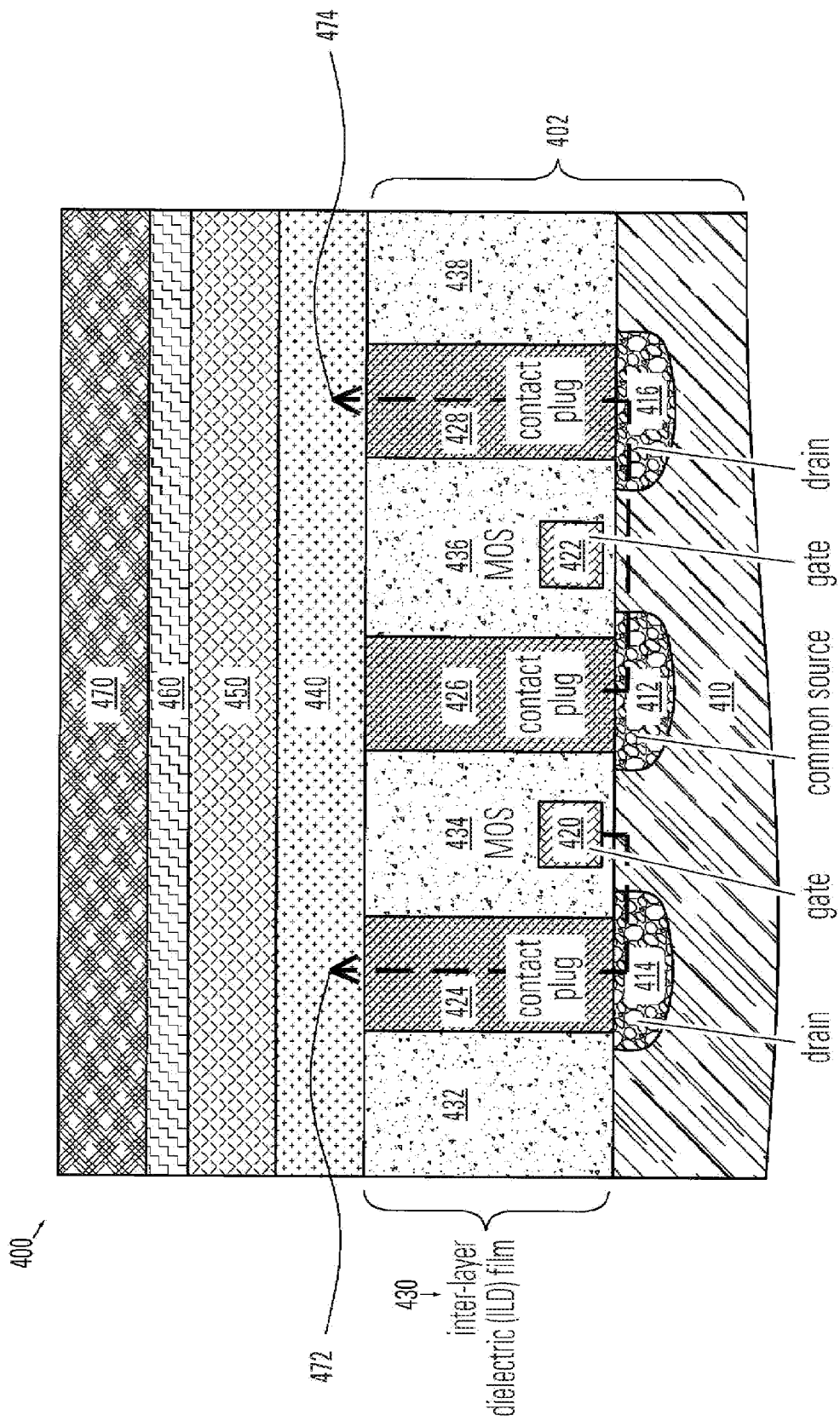
FIG. 4 illustrates a cross-sectional view of a process diagram showing a first step in the manufacturing of the bistable resistance random access memory with deposition of various layers over a common source array structure in accordance with the present invention.

In FIG. 4, there is shown a cross-sectional view of a process diagram showing a first step in the manufacturing of the bistable resistance random access memory 400 with deposition of various layers over a common source array structure 402. Access transistors are formed by an n-type terminal 412 acting as a common source region and n-type terminals 414 and 416 acting as drain regions in a substrate 410. Polysilicon word (gate) lines 420, 422 form the gates of the access transistors. An inter-layer dielectric 430 includes dielectric fills 432, 434, 436 and 438 such that the dielectric fill 434 is formed over the polysilicon word line 420 and the dielectric fill 436 is formed over the polysilicon word line 422. Conductive structures including plug structures 424, 426, 428 are formed. The conductive material can be tungsten or other materials and combinations suitable for the plug structures. The plug structure 426 contacts the source region 412 and acts similarly to a common source line along a row in the array. The plug structures 424, 428 contact the drain terminals 414 and 416, respectively.

A conductive layer 440 that functions as a bottom electrode is formed over the dielectric fill layers 432, 434, 436, 438 and contact plugs 424, 426, 428. The conductive layer 440 comprises a metal line selected from a material such as Al, TiN or other types of conductive materials. A suitable thickness of the conductive layer 440 is about 50 Å to about 200 Å. A programmable resistive memory material (also referred to as a resistor film) 450 is deposited over the conductive layer 440. The thickness of the programmable resistive memory material 450 is typically selected in the range of about 100 Å to about 1000 Å. A polysilicon layer 460 overlies the programmable resistive memory material 450. The thickness of the polysilicon layer 460 is also typically selected in the range of about 100 Å to about 1000 Å. Other materials with a high selective adjacent film can also be used in place of the polysilicon layer 460. A silicon nitride (SiN) layer 470, with a thickness of about 200 Å to about 1000 Å, overlies the polysilicon layer 460. A first electrical current 472 flows from the first polysilicon gate 420, through the drain 414, through the contact plug 426, through the conductive layer 440, to the programmable resistive memory material 450. A second electrical current 474 flows from the common source region 412, through the drain 416, through the contact plug 428, through the conductive layer 440, and to the programmable resistive memory material 450.

Figure 5:
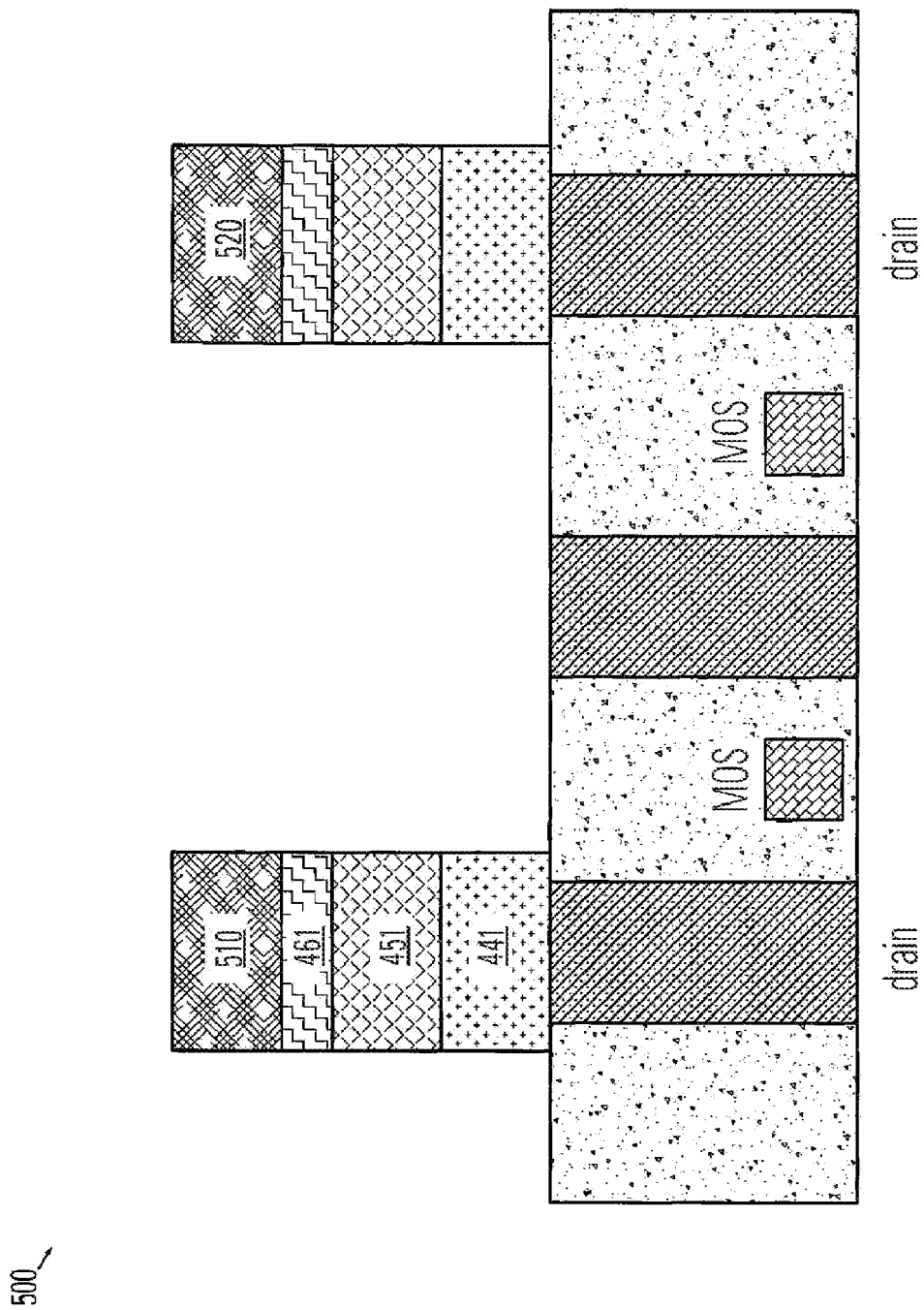
FIG. 5 illustrates a cross-sectional view of a process diagram showing a second step in the manufacturing of the bistable resistance random access memory with photolithography and etching of pillars in accordance with the present invention.

As shown in FIG. 5, there is a cross-sectional view of a process diagram 500 showing a second step in the manufacturing of the bistable resistance random access memory with photolithography and etching of pillars. A photolithographic process transfers a pattern from a photomask to the structure in the bistable resistance random access memory followed by etching of selected selections to form pillars 510, 520. The pillar 510 comprises a silicon nitride segment 471, a polysilicon segment 461 underlying the silicon nitride segment 471, a programmable resistive memory material segment 451 underlying the polysilicon segment 461 and a conductive segment 441 underlying the programmable resistive memory material segment. Each of the pillars 510, 520 has a suitable thickness ranging from about 50 nm to about 200 nm.

Figure 6:
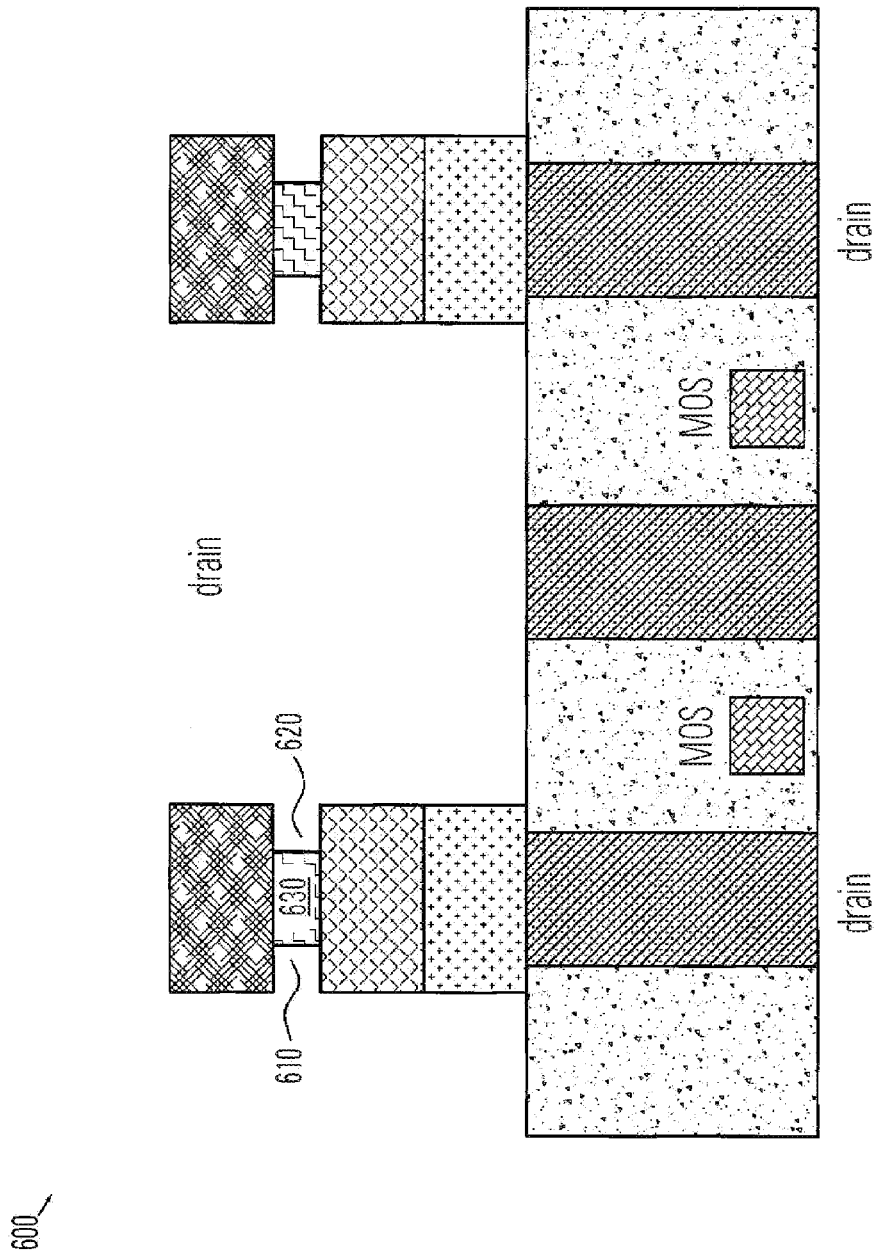
FIG. 6 illustrates a cross-sectional view of a process diagram showing a third step in the manufacturing of the bistable resistance random access memory with isotropic etching to form voids in accordance with the present invention.

FIG. 6 illustrates a cross-sectional view of a process diagram 600 showing a third step in the manufacturing of the bistable resistance random access memory with isotropic etching to form voids. The polysilicon segment 461 in the pillar 510 is isotropically etched to form voids 610, 620 on each side, resulting in a polysilicon member 630. In other words, the isotropic etch step is carried out to undercut the areas underneath the silicon nitride segment 471 in order to create the polysilicon member 630 with the voids 610, 620. Tungsten may be used as a suitable alternative material in place of the polysilicon layer 460. Other suitable materials may also be used in place of polysilicon in implementing the polysilicon member 630, provided an alternative material is selected with a selectivity that is different from the selectivities of the materials underlying and overlying the polysilicon segment 461, so that the isotropic etching of the polysilicon segment 461 does not damage layers above or beneath the polysilicon segment 461. In this embodiment, the material underlying the polysilicon member 630 is the programmable resistive memory material segment 451, which has a different selectivity characteristic than the selectivity of the polysilicon member 630. The material overlying the polysilicon member 630 is the silicon nitride segment 471, which has a different selectivity characteristic than the selectivity of the polysilicon member 630. A suitable length of the polysilicon member 630 after isotropic etching ranges from about 10 nm to about 100 nm.

Figure 7:
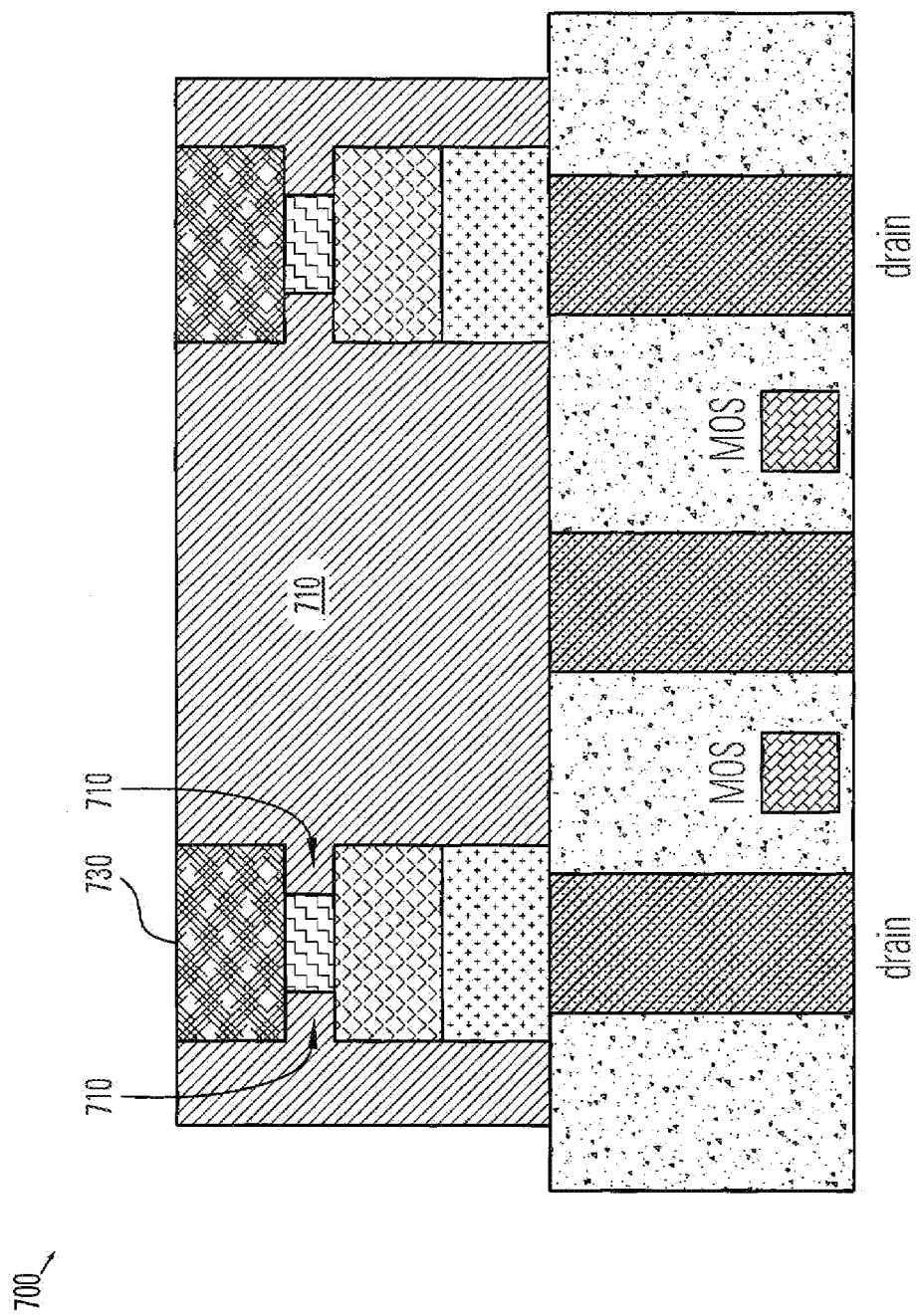
FIG. 7 illustrates a cross-sectional view of a process diagram showing a fourth step in the manufacturing of the bistable resistance random access memory with spin on glass and reflow to fill up the voids in accordance with the present invention.

FIG. 7 illustrates a cross-sectional view of a process diagram 700 showing a fourth step in the manufacturing of the bistable resistance random access memory with SOG spin and reflow to fill up the voids 610, 620. A SOG spin and reflow, with a mixture of SiO2 and dopant 710, is carried out to fill up the voids 610, 620 and surrounding areas of the pillar 510. A surface area adjacent to a top surface 730 of the silicon nitride segment 471 is polished to remove excess reflow materials. Embodiments of the process for polishing include a chemical mechanical polishing process, followed by brush clean and liquid and or gas clean procedures, as known in the art.

Figure 8:
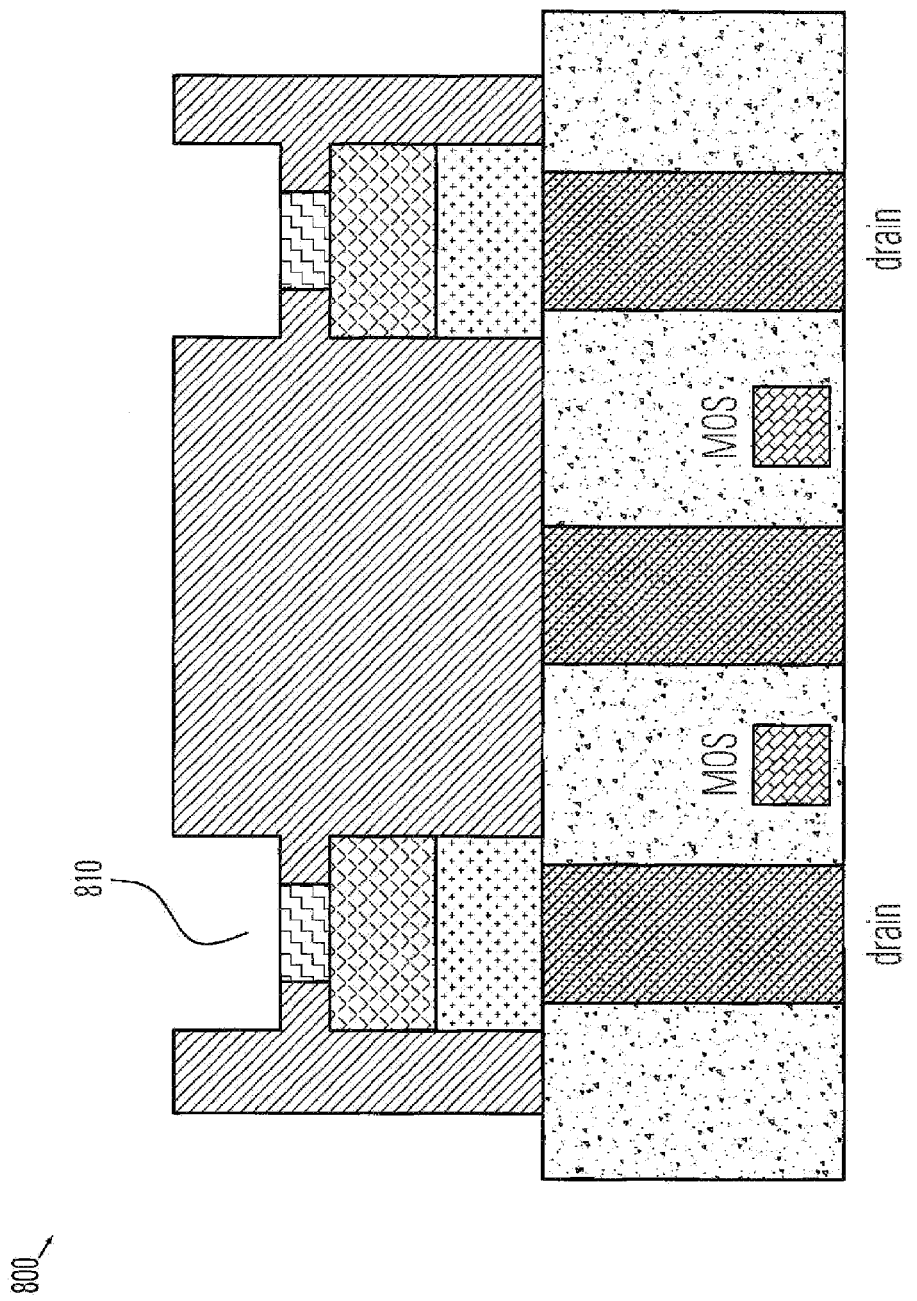
FIG. 8 illustrates a cross-sectional view of a process diagram showing a fifth step with a dip of silicon nitride in accordance with the present invention.

In FIG. 8, there is shown a cross-sectional view of a process diagram 800 showing a fifth step with a dip of silicon nitride. The term "dip" refers to either wet etching or dry etching. The purpose of the dip step is to remove the area occupied by the silicon nitride segment 471 with a first etching chemistry, thereby creating a hollow space 810 and exposing to the polysilicon member 630.

Figure 9:
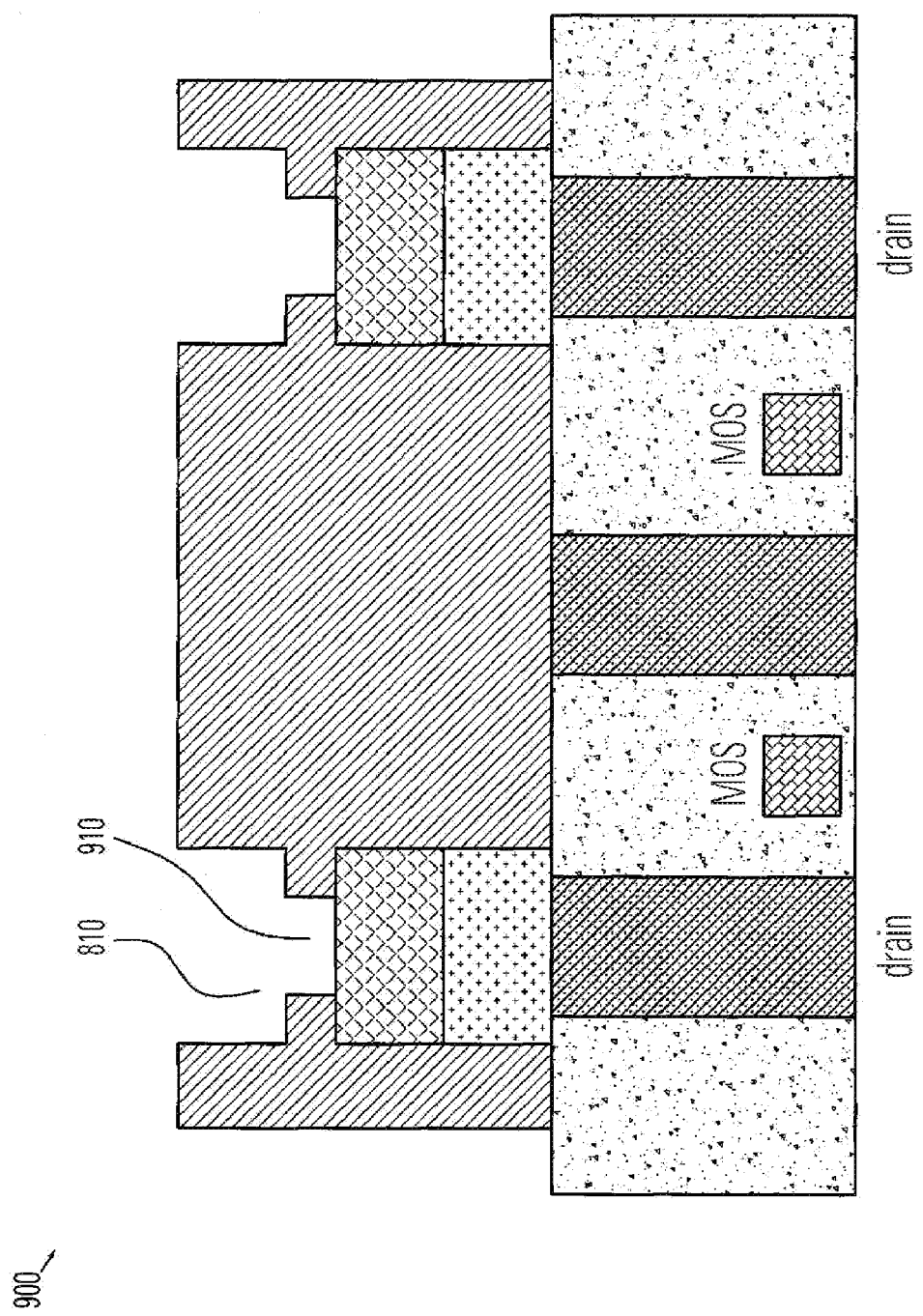
FIG. 9 illustrates a cross-sectional view of a process diagram showing a sixth step with etching on a programmable resistive memory material in accordance with the present invention.

FIG. 9 illustrates a cross-sectional view of a process diagram 900 showing a sixth step with etching of the programmable resistive memory material. A second etching chemistry is selected for etching the area previously occupied by the polysilicon member 630 until it reaches the top surface of the programmable resistive memory material segment 451, which creates a hollow space 910.

Figure 10:
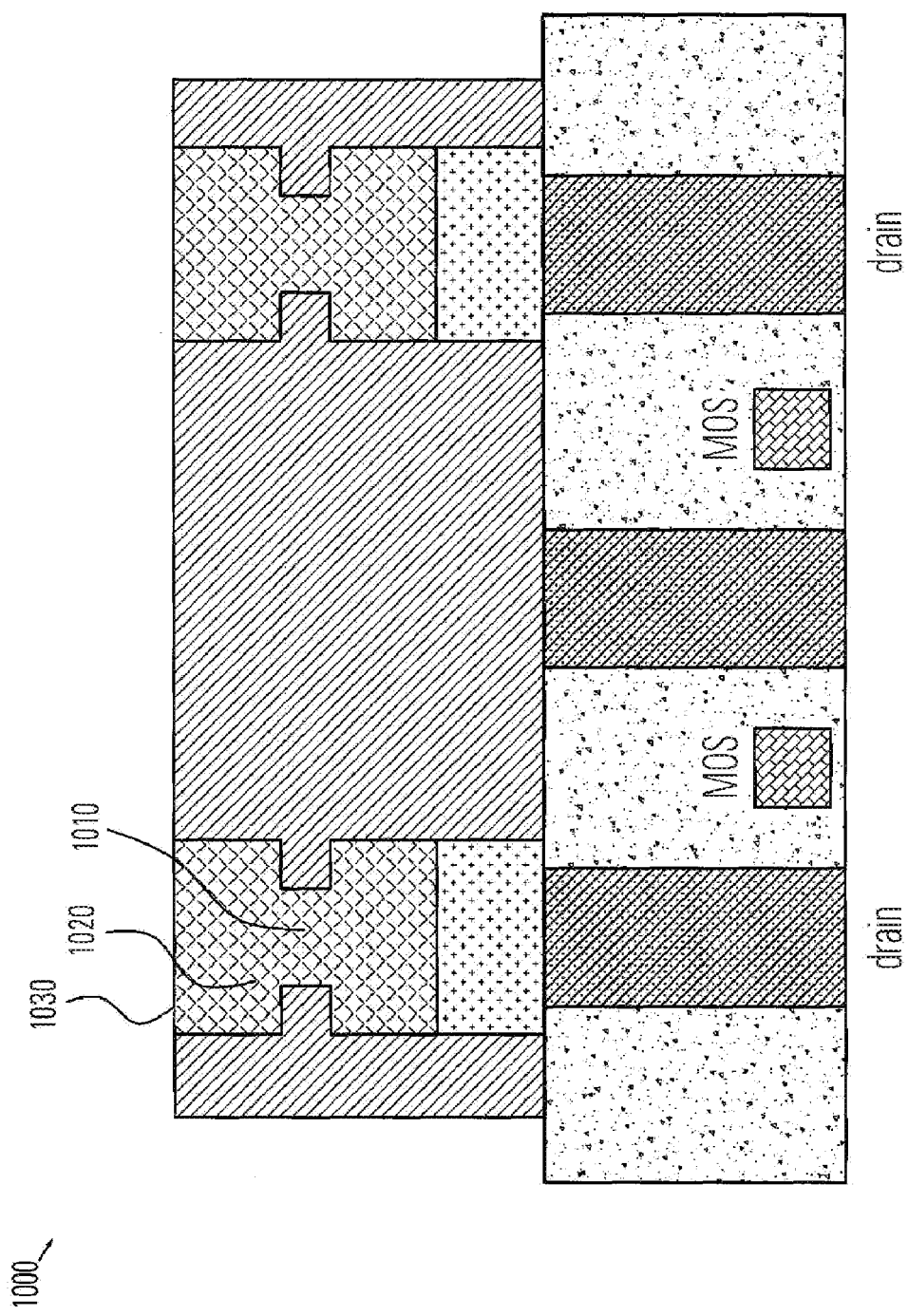
FIG. 10 illustrates a cross-sectional view of a process diagram showing a seventh step with the deposition and etch back of a programmable resistive memory material in accordance with the present invention.

FIG. 10 illustrates a cross-sectional view of a process diagram 1000 showing a seventh step with the deposition and etch back of a programmable resistive memory material. A programmable resistive memory material 1010 is deposited into the hollow space 910, the area previously occupied by the polysilicon member 630, and a programmable resistive memory material 1020 is deposited into the hollow space 810, the area previously occupied by the silicon nitride 471. Any excess material from the deposition of the programmable resistive memory material is etched back, resulting in a smooth surface 1030 across the top of the programmable resistive memory material.

Figure 11:
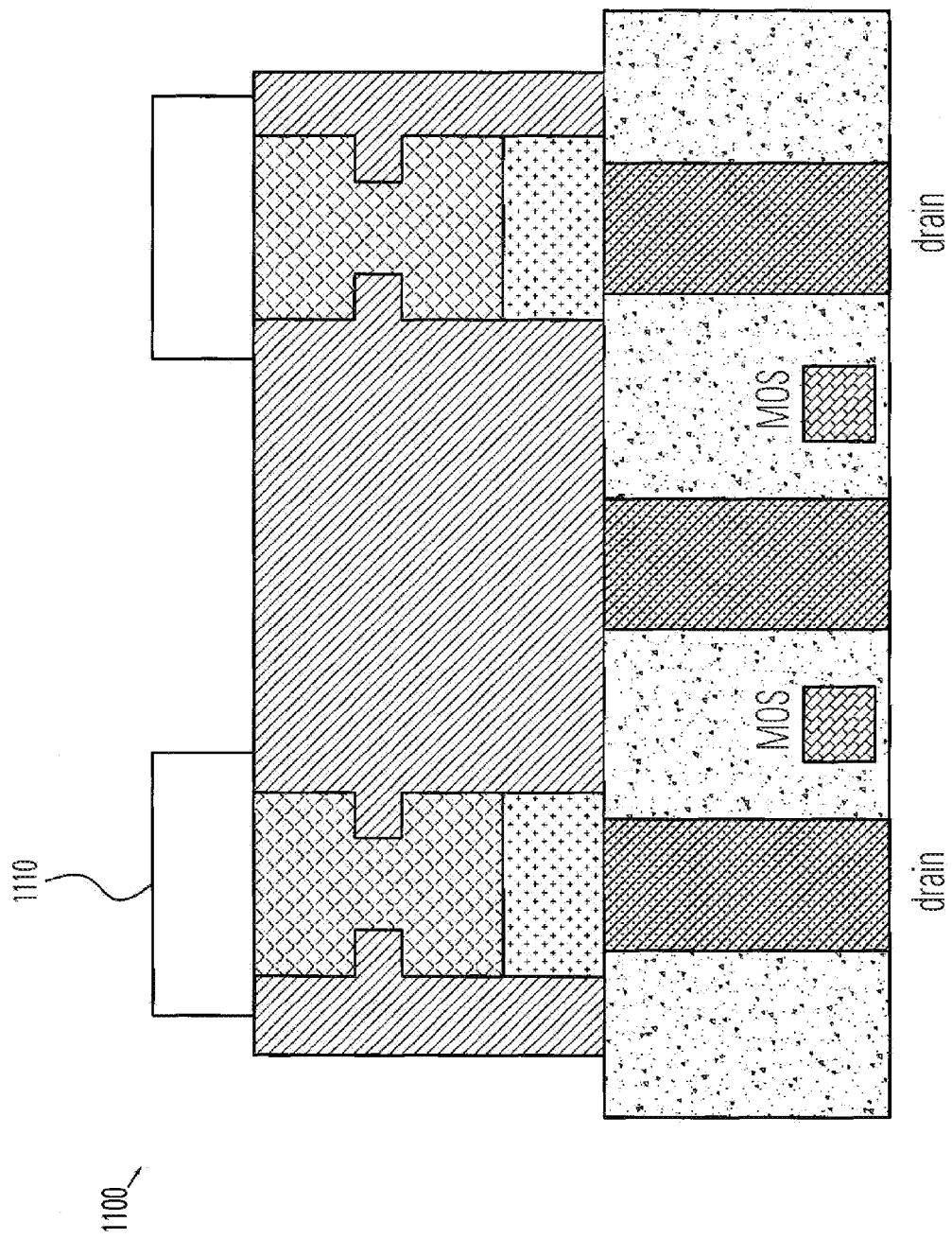
FIG. 11 illustrates a cross-sectional view of a process diagram showing an eighth step with the deposition and patterning of a top electrode in accordance with the present invention.

FIG. 11 illustrates a cross-sectional view of a process diagram showing an eighth step including the deposition and patterning of a top electrode. A top electrode 1110 is deposited over the programmable resistive memory material 1030 such that the top electrode 1110 is in contact with the programmable resistive memory material 1030.

Embodiments of the memory cell include phase change based memory materials, including chalcogenide based materials and other materials, for the bridge. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as TeaGebSb100−(a+b). One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys can be switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_xSb_yTe_z$ with x:y:z=2:2:5. Other compositions of $Ge_xSb_yTe_z$ include x: 0~5; y: 0~5; z: 0~10.

Other programmable resistive memory materials may be used in other embodiments of the invention, including N2 doped GST, GexSby, or other material that uses different crystal phase changes to determine resistive; PrxCayMnO3, PrSrMnO, ZrOx, or other material that uses an electrical pulse to change the resistive state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistive state controlled by an electrical pulse; a colossal magnetoresistive (CMR) material such as PrxCayMnO3 with x:y=0.5:0.5, or other composition with x: 0~1; y: 0~1, or another CMR material that includes Mn oxide; and a 2-element compound such as NixOy where x:y=0.5:0.5, or other composition with x: 0~1; y: 0~1.

For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive; the invention is defined by the following appended claims.

We claim:

1. A memory device, comprising:
   first and second electrodes;
   first and second memory members disposed between the first and second electrodes such that the second electrode is below the first and second memory members, the first and second memory members having sides aligned with sides of the second electrode, the first and second memory members having first and second widths respectively;
   a kernel member comprising programmable resistive memory material disposed between the first and second memory members, the kernel member having a third width smaller than the first and second widths; and
   a transistor controlling whether current flows through the first and second memory members and the kernel member.

2. The device of claim 1, further comprising a dielectric disposed between the first and second memory members and surrounding the kernel member.

3. The device of claim 1, wherein:
   the first memory member has a surface electrically coupled to the first electrode; and the second memory member has a surface electrically coupled to the second electrode.

4. The device of claim 1, wherein the second memory member has sides aligned with sides of the first memory member.

5. The device of claim 4, wherein the first electrode has sides aligned with the sides of the first and second memory members.

6. The device of claim 1, wherein the kernel member is centered on the first memory member.

7. The device of claim 1, wherein the first memory member comprises a combination of two or more materials from the group of Ge, Sb, Te, Se, In, Ti, Ga, Bi, Sn, Cu, Pd, Pb, Ag, S, or Au.

8. The device of claim 7, wherein second memory member comprises a combination of two or more materials from the group of Ge, Sb, Te, Se, In, Ti, Ga, Bi, Sn, Cu, Pd, Pb, Ag, S, or Au.

9. The device of claim 1, wherein the kernel member comprises a combination of two or more materials from the group of Ge, Sb, Te, Se, In, Ti, Ga, Bi, Sn, Cu, Pd, Pb, Ag, S, or Au.

10. The device of claim 1, wherein the kernel member has at least two solid phases which are reversibly inducible by a current.

11. The device of claim 1, wherein the first memory member comprises a first memory material and the second memory member comprises a second memory material having different composition from the first memory material.

12. The device of claim 11, wherein the first memory material comprises a memory material selected from a GeSbTe, a colossal magnetoresistance material, a two-element compound or a polymer material, and the second memory material comprises a memory material selected from a GeSbTe, a colossal magnetoresistance material, a two-element compound or a polymer material.

13. The device of claim 1, wherein the first electrode comprises material selected from the group of TiN, TaN or Al.

14. The device of claim 1, wherein the second electrode comprises material selected from the group of TiN, TaN or Al.

15. A memory device, comprising:
    first and second electrodes vertically separated and having opposed contact surfaces;
    an upper programmable resistive memory member having a contact surface in electrical contact with the first electrode;
    a lower programmable resistive memory member having a contact surface in electrical contact with the second electrode, the upper and lower programmable resistive members having sides that align with sides of the bottom electrode;
    a kernel member comprising programmable resistive memory material disposed between the upper programmable resistive memory member and the lower programmable resistive memory member, the kernel member centered on the lower programmable resistive memory member; and
    a transistor controlling whether current flows through the upper and lower programmable resistive memory members and the kernel member.

16. A memory device comprising:
    an electrode pair, a first electrode of the electrode pair positioned above a second electrode of the electrode pair, the first electrode having a first width, the second electrode having a second width smaller than the first width;
    a kernel member;
    a memory member disposed between one of the electrodes of the electrode pair and the kernel member, the memory member having a width greater than that of the kernel member; and
    a dielectric material surrounding the memory member, the kernel member, and the second electrode; and
    a transistor controlling whether current flows through the memory member and the kernel member.

17. The device of claim 16, wherein the electrode pair is selected from the group of TiN, TaN or Al.

18. The device of claim 16, wherein the memory element comprises a combination of two or more materials from the group of Ge, Sb, Te, Se, In, Ti, Ga, Bi, Sn, Cu, Pd, Pb, Ag, S, or Au.

19. The device of claim 16, wherein the kernel member comprises a combination of two or more materials from the group of Ge, Sb, Te, Se, In, Ti, Ga, Bi, Sn, Cu, Pd, Pb, Ag, S, or Au.

* * * * *